United States Patent
Bruce et al.

(10) Patent No.: US 7,062,399 B1
(45) Date of Patent: Jun. 13, 2006

(54) RESISTIVITY ANALYSIS

(75) Inventors: Michael R. Bruce, Austin, TX (US); Victoria J. Bruce, Austin, TX (US); Rosalinda M. Ring, Austin, TX (US); Edward Jr. I. Cole, Albuquerque, NM (US); Charles F. Hawkins, Albuquerque, NM (US); Paiboon Tangyungong, Albuquerque, NM (US)

(73) Assignee: Advance Micro Devices, Inc., Sunnyvale, CA (US)

( * ) Notice: Subject to any disclaimer, the term of this patent is extended or adjusted under 35 U.S.C. 154(b) by 784 days.

(21) Appl. No.: 09/586,518

(22) Filed: Jun. 2, 2000

(51) Int. Cl.
*G01R 31/14* (2006.01)

(52) U.S. Cl. .................... 702/117; 324/750
(58) Field of Classification Search ............ 702/35, 702/57–59, 64, 65, 69, 72, 75–80, 108, 117–126, 702/133, 134, 183–186, 189; 324/500, 501, 324/512, 520–535, 537, 750–756, 763, 765, 324/538, 555, 600, 691, 693, 702, 703, 705, 324/96, 97, 105; 438/14–18; 326/37–47, 326/101; 714/25, 30, 32, 33, 37, 40, 41, 724–725
See application file for complete search history.

(56) References Cited

U.S. PATENT DOCUMENTS

| 4,640,626 | A |   | 2/1987  | Schmid et al. ............... 250/310 |
|-----------|----|---|---------|--------------------------------------|
| 4,875,209 | A | * | 10/1989 | Mathewes, Jr. et al. ....... 714/32 |
| 5,414,370 | A |   | 5/1995  | Hashinaga et al. ........... 324/760 |
| 5,430,305 | A | * | 7/1995  | Cole, Jr. et al. ......... 250/559.07 |
| 5,504,017 | A | * | 4/1996  | Yue et al. ....................... 374/5 |
| 5,557,559 | A | * | 9/1996  | Rhodes ......................... 324/752 |
| 5,589,776 | A | * | 12/1996 | Morant ......................... 324/534 |
| 5,872,360 | A | * | 2/1999  | Paniccia et al. ........... 250/341.4 |
| 6,078,183 | A | * | 6/2000  | Cole, Jr. ....................... 324/750 |
| 6,146,014 | A |   | 11/2000 | Bruce et al. ................. 374/120 |
| 6,154,039 | A | * | 11/2000 | Wu ............................. 324/752 |
| 6,160,407 | A | * | 12/2000 | Nikawa ....................... 324/750 |
| 6,168,311 | B1 |   | 1/2001  | Xiao et al. ............. 250/227.11 |
| 6,255,124 | B1 | * | 7/2001  | Birdsley ...................... 324/750 |
| 6,377,897 | B1 | * | 4/2002  | Boyington et al. ........... 702/81 |

* cited by examiner

*Primary Examiner*—Marc S. Hoff
*Assistant Examiner*—Mohamed Charioui

(57) ABSTRACT

According to an example embodiment of the present invention a semiconductor die having a resistive electrical connection is analyzed. Heat is directed to the die as the die is undergoing a state-changing operation to cause a failure due to suspect circuitry. The die is monitored, and a circuit path that electrically changes in response to the heat is detected and used to detect that a particular portion therein of the circuit is resistive. In this manner, the detection and localization of a semiconductor die defect that includes a resistive portion of a circuit path is enhanced.

23 Claims, 11 Drawing Sheets

610

710

910

1010

RESISTIVITY ANALYSIS

RELATED PATENT DOCUMENTS

The following patent documents are related to the present invention and are hereby incorporated by reference in their entirety; these U.S. patent applications are identified by their Ser. Nos. as follows: 09/034,546, filed on Mar. 3, 1998 and entitled "Thermally-induced Voltage Alteration (TIVA)", now U.S. Pat. No. 6,078,183; and 09/586,505, entitled "Method and Apparatus for Analyzing Functional Failures In Integrated Circuits", now U.S. Pat. No. 6,549,022 and 09/586,572, entitled "Data Processing Device Test Apparatus and Method Therefor" now U.S. Pat. No. 6,546,513, which have been concurrently filed herewith.

GOVERNMENT RIGHTS

This invention was made with U.S. Government support under Contract No. DE-AC04-94AL85000 awarded by the U.S. Department of Energy. The U.S. Government has certain rights in the invention.

FIELD OF THE INVENTION

The present invention relates generally to semiconductor devices and their fabrication and, more particularly, to testing and defect analysis of semiconductor devices.

BACKGROUND OF THE INVENTION

The electronics industry continues to rely upon advances in semiconductor technology, including integrated circuits (ICs), to realize higher-functioning devices in more compact areas. For many applications, realizing higher-functioning devices requires integrating a large number of electronic devices into a single silicon wafer. In addition, many of the individual devices within the wafer are being manufactured with smaller physical dimensions. As the number of electronic devices per given area of the silicon wafer increases, and as the size of the individual devices decreases, testing processes become more important and more difficult.

Many integrated circuit die include circuits that are suspect defects, and these defects can recover or fail under particular operating conditions and at higher temperatures. For instance, circuit sites exhibiting temperature sensitive defects, such as resistive connection, can recover when heated. Traditionally, isolation of IC defects has been attempted by operating the die in a manner that causes a failure to occur and by attempting to attribute the failure to a malfunctioning device in the IC. Such electrical testing, however, does not always work because many failures and malfunctions can result from a variety of different types of defects and defects at non-suspect circuitry locations.

One such defect that can cause difficulty in determining the cause of a failure in an IC is a resistive electrical connection. Resistive interconnections have been a major IC manufacturing problem in terms of yield, performance, and reliability, and this problem is expected to increase in importance as the number of interconnection levels and operating frequencies increase. While the ability to localize these defective interconnections can be extremely useful for diagnosing IC failures and implementing corrective action, unfortunately, resistive interconnections on failing ICs can be difficult and time consuming to localize because they often require high frequency operation to produce a functional failure and a great deal of repetitive probing to identify.

Defect localization is complicated by the employment of multiple levels of metal interconnections that obscure lower conductor levels. For flip-chip packaging in which the die is packaged top-side down, front side examination techniques of the die are often extremely difficult and time-consuming. These difficulties have led to the development and use of more advanced IC analysis techniques involving both back side and front side approaches, including those discussed in "TIVA and SEI Developments for Enhanced Front and Backside Interconnection Failure Analysis", ESREF, pp. 991–996 (1999), by E. I. Cole Jr., P. Tangyunyong, E. S. Benson, and D. L. Barton. Unfortunately, previously known methods, such as infrared optical microscopy, light emission microscopy, and transistor logic state mapping are not effective in localizing resistive interconnections.

SUMMARY OF THE INVENTION

The present invention is exemplified in a number of implementations and applications, some of which are summarized below. According to an example embodiment, the present invention is directed to a method for analyzing a semiconductor die. Heat is directed to the die as the die is undergoing a state-changing operation to cause a failure due to suspect circuitry. The die is monitored, and a circuit path that electrically changes in response to the heat is detected and used to detect that a particular portion of the circuit is resistive. In this manner, the precise location of a semiconductor die defect, including a resistive portion of a circuit path, is made possible.

According to another example embodiment of the present invention, a system is adapted to analyze a semiconductor die. The system includes a stimulation arrangement adapted to operate the die in a state-changing operation, a laser-scanning arrangement adapted to direct heat to a portion of a circuit path in the die, and a detection arrangement adapted to monitor the die and detect therein a resistive portion of the circuit path that reacts to the heat.

According to another example embodiment of the present invention, an integrated circuit (IC) is operated with an IC tester under frequency, voltage and temperature conditions that produce functional IC failure about or approximately 50% of the time during cycling of the IC. A laser is scanned across the IC and locally heats the portions of the IC at which the laser is directed. The localized heating changes the resistance of the interconnections. When an interconnection that produces a failure has its resistance altered, the functional IC failure rate changes. When a change in the failure rate is detected, the resistive interconnection can be localized. A gated latch captures the logic state of an I/O pin that changes with the change in failure rate. The trigger for the latch is provided by the IC tester, and the output of the latch is fed to an amplifier that controls the contrast in an IC imaging system adapted to create an image of the IC being tested. As the failure rate changes, the amplifier produces contrast variations in the image of the IC, and the contrast variations are used to localize the resistive defect.

The above summary of the present invention is not intended to describe each illustrated embodiment or every implementation of the present invention. The figures and detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
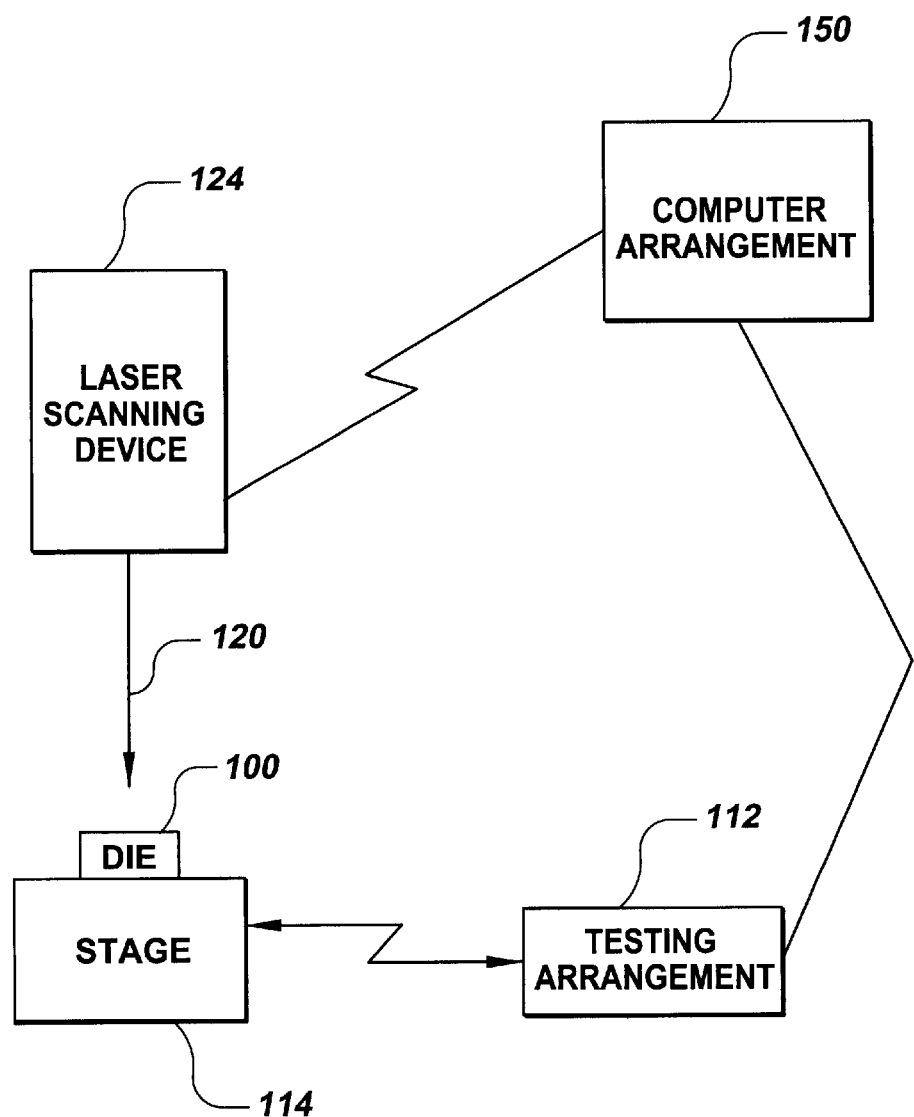
FIG. 1 shows a system for analyzing a semiconductor device, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable for a variety of different types of semiconductor devices, and the invention has been found to be particularly suited for dies susceptible to failure due to undesired changes of resistivity. As will be discussed below, among other failures of this type, these failures include conductive vias becoming more resistive in some instances, less resistive in other instances, and shorts and opens. While the present invention is not necessarily limited to such applications, various aspects of the invention may be appreciated through a discussion of various examples using this context.

According to an example embodiment of the present invention, the resistivity of a semiconductor die having suspect circuitry that includes a multitude of circuit paths is analyzed. As the suspect circuitry undergoes a state-changing operation, one of the circuit paths that electrically changes in response to heat is identified. It has been discovered that the electrical response to the heat can be used to identify that the circuit path has an electrically resistive connection. This is particularly useful for identifying portions of circuitry in a semiconductor die, such as interconnects and vias, which exhibit a resistive defect. The identification is applicable to dies including those having multi-level interconnects and vias. In addition, the resistive defect can be distinguished from other operational defects in the die, such as those occurring as a result of defective transistors or other devices within the die.

Operational failures can occur, for example, when an IC is operated at a clock frequency that is too high, or when one or more circuit elements within the IC produce an excessive or unaccounted for signal delay in switching in a transistor, or in propagating a signal along a path. Operational failures can also occur when the IC is powered by a power supply voltage or current which is outside a range for which the IC has been designed, or when the IC is operated at a temperature outside a normal operating range for the IC. Operational failures can arise as a result of particular operating conditions for the IC even though the IC operates within specifications under other operating conditions. Thus, an operational failure can result from suboptimal performance of particular circuit elements in the IC which produce timing errors.

One example of such operational failure results when an electrical signal arrives at a destination too early or too late, resulting in an incorrect value of an output state of the IC. Circuit elements that can be involved with such failures include, for example, switching transistors or functional circuit blocks that switch between logic states at a rate that is slower than normal, and interconnections in the IC which have a resistance larger than an expected value. In general, anything within an IC that results in or contributes to a particular signal within the IC being advanced or delayed in propagation by one or more clock cycles, compared with the time at which the signal should appear, can result in an operational failure in the IC.

In one particular example embodiment of the present invention, a semiconductor die is operated near a transition point between defective and recovery states. A laser is used to heat a portion of the semiconductor die, and a response from the die is detected. The laser can be used to heat the die, for example, by raster scanning the laser beam across the die, stepping the beam across the die, pulsing the laser, or directing the laser in a spot mode at a selected portion of the die. As an alternative or in addition to the laser, other heating devices such as a peltier, heat tape, and conventional heaters can be used to heat the die. Cooling devices, such as a thermoelectric module, a refrigeration system or a flow of gas, may also be employed to regulate the heating rate. The response is compared to a known reference response, such as that from a non-defective die of the same design as the defective die, or from design characteristics of the die.

Comparing responses may include comparing a timing response between the defective die and a reference die, or between in-range and out-of-range specifications using the same die, wherein a delay or advance in response from a particular circuit path within the die is an indication that the circuit path includes the defect. The timing discrepancies in the responses are noted and used to identify the defective portion of the die. In one instance, the defective portion is identified using an image of the die. In another instance, a circuit layout of the heated portion of the die is used to correlate the discrepancies to a resistive circuit path in the die, such as by using the coordinates of the defective portion. The suspect circuit path can then further be imaged to more specifically locate a defective portion of the circuit path.

As mentioned hereinabove, one application for which the present invention is particularly useful involves distinguishing a resistive defect from other operational defects in a die. At times, particular failure modes in a die are used to pinpoint a particular type of defect. However, such failure modes can be inadequate for appropriately locating a defective portion of the die when the die includes a resistive circuit path because such a resistive path can generate a false failure mode.

FIG. 1 is a system adapted to analyze a semiconductor die 100, according to another example embodiment of the present invention. The die is positioned on a stage 114, and a testing arrangement 112 is coupled to the die and used to operate the die in a state-changing mode that creates a failure condition. A laser-scanning device 124 is used to scan a laser beam 120 over the die 100 and to cause a response in the die. The testing arrangement 112 is used to detect the response. A computer arrangement 150 is coupled to the testing arrangement 112 and to the laser scanning device 124. Using the computer arrangement, the detected response is correlated with the particular position of the die to which the laser beam 120 is directed at the instant that the response is detected. In this manner, the portion of the die that causes the response can be detected.

Figure 1A:
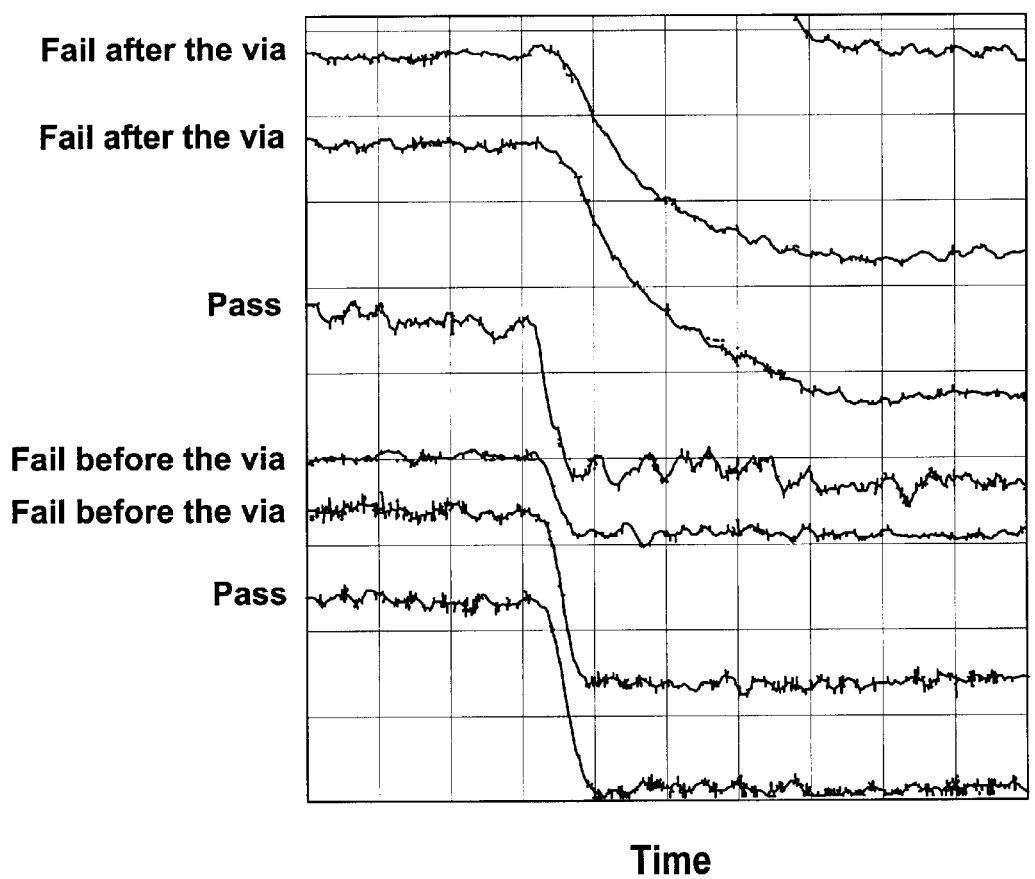
FIG. 1A is a timing diagram for detecting a resistive interconnect in a die, according to another example embodiment of the present invention.

Once the position of the defective portion of the die has been detected, the portion of the die that is defective can be identified. One example manner in which to identify the defect is to obtain an image of the defective portion of the die, such as a cross-sectional image, and examine the image to identify the particular via or interconnect that is defective. Another manner is to correlate the location of the laser scan with a known circuit layout and identify the defective portion therefrom. In addition, an RC time constant can be used to identify a defect as, for example, provided in wavelength acquisitions by a tool such as an IDS 10000 e-beam probe (for front-side analysis) and an IDS 2000 electro-optic probe (for back side analysis), both available from Schlumberger Limited. FIG. 1A shows an example graph created using an RC time constant to assist in the identification of a suspect resistive defect. The signal lines are labeled showing pass and fail signals as the die is being operated.

Figure 2:
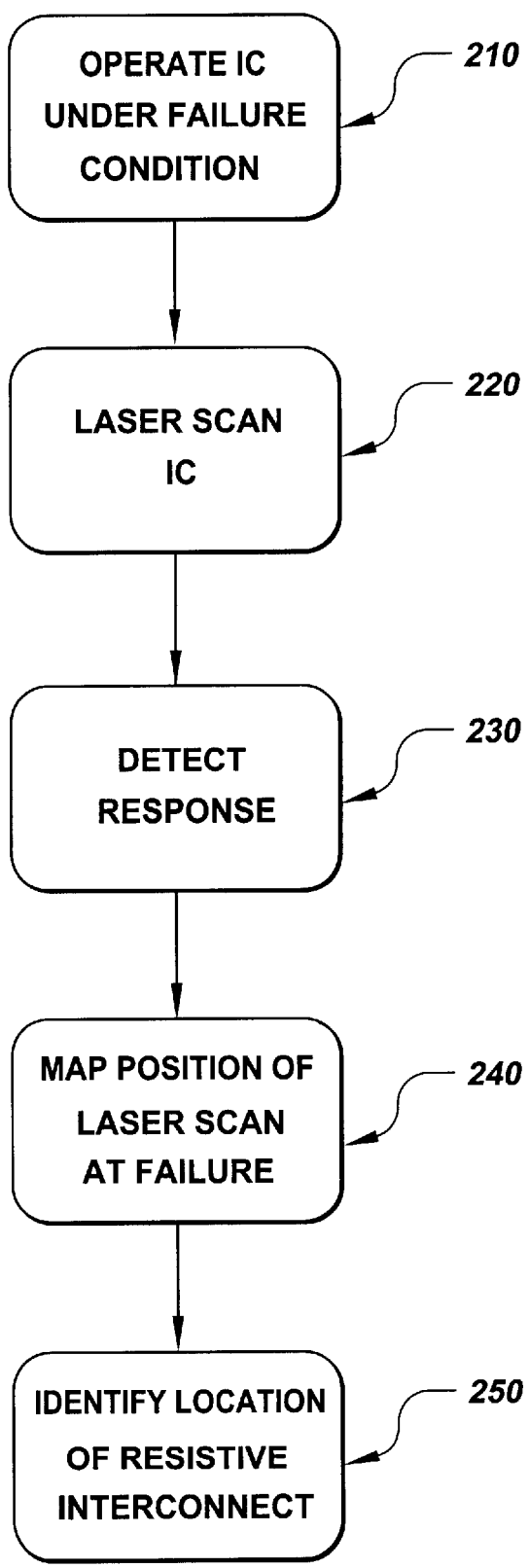
FIG. 2 is a flow diagram for analyzing a semiconductor device, according to another example embodiment of the present invention.

FIG. 2 is an example flow diagram showing one approach for identifying a resistive interconnect in an integrated circuit (IC), and can be used in connection with the examples discussed herein. At block 210, an integrated circuit is operated under a failure condition. The IC is scanned with a laser beam at block 220, and a response from the IC that includes a transition between a failure and recovery state of the IC is detected at block 230. The position on the IC to which the laser beam is scanned when the response is detected is mapped at block 240 and used to identify the location of a resistive interconnect at block 250.

Operating an IC die under a failure condition can be accomplished in various manners. In some instances, the die is allowed to operate under normal operating conditions and is analyzed therefrom. In other instances, the die is operated under conditions that are selected to cause a failure condition. For example, the die can be operated under conditions that include selected clock speeds, temperatures, logic states, operating (power) supply voltage, or other parameters that have been associated with a defect. In addition, the die can be operated using a selected test pattern that includes a pause in the signal to provide the die time to cool between cycles when being operated in a loop. Once a particular failure is identified to occur under a particular operating condition, that operating condition can be used to test the die under similar conditions to cause the failure to recur. In addition, the operating conditions can be selected so that the die fails at a selected failure rate, and variations in the failure rate that result in response to the application of heat can be used to analyze the die. For more information regarding the operation of a die under failure conditions, reference may be made to the above-referenced U.S. patent application Ser. No. 09/034,546, now U.S. Pat. No. 6,078,183 entitled "Thermally-induced Voltage Alteration (TIVA)."

Figure 3:
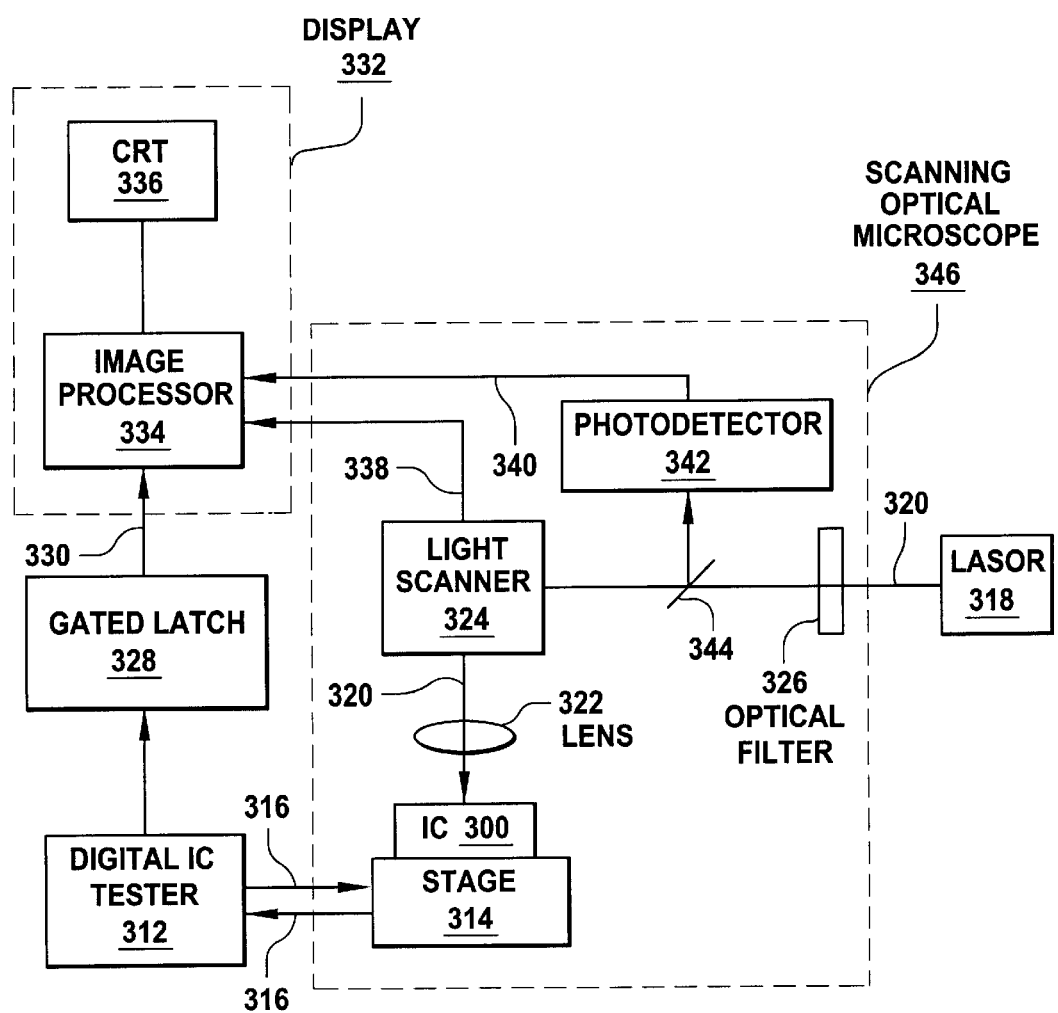
FIG. 3 shows a system for analyzing a semiconductor device, according to another example embodiment of the present invention.

Consistent with the teachings with the above-referenced patent documents entitled "Method and Apparatus for Analyzing Functional Failures in Integrated Circuits," FIG. 3 shows another system that is adapted to detect and analyze a resistive portion of a circuit path, according to another example embodiment of the present invention. An integrated circuit (IC) 300 is placed on a stage 314 for analysis. A laser beam 320 is scanned onto the IC 300. The laser may, for example, generate a beam having a wavelength of about 1300 nanometers that is advantageous for passing through silicon in the back side of an IC die, and for generating heat without necessarily generating significant photocurrent in the die. The beam is generated by a laser 318 and passed through an optical filter 326, a beam splitter 344 and to a light scanner 324. The light scanner 324 causes the beam to be scanned onto the IC 300 through a lens 322.

A digital IC tester 312, such as Model ATS FT or Model ATS Blazer! that are available from Integrated Measurement System, Inc., or a computer-controlled switch matrix (not shown), is communicatively coupled to the IC 300. The IC tester 312 is adapted to input a set of test vectors (e.g., input voltages) to the IC 300 and to detect output states from the IC 300 in response to the input test vectors. The test vectors may include, for example, input voltages that are provided to input pins of the IC 300 all at once or in a predetermined sequence in order to produce a desired response in the form of one or more output states as defined by output voltages at output pins of the IC 300. In one implementation, the IC 300 is operated under conditions designed to produce functional failures at a predetermined rate. For additional information regarding a computer-controlled switch matrix, reference may be made to the U.S. Patent Application referred to hereinabove and entitled "Data Processing Device Test Apparatus and Method Therefor."

The rate of failure within the IC 300 can also be changed by varying the power level in the focused laser beam, such as by repeatedly scanning the IC 300 at different power levels, pulsing the laser, or by stopping the laser beam at a selected location of particular circuit elements and then varying the power level of the laser beam over time.

As the laser is scanned across the IC 300, circuitry in the IC 300 is heated, causing the resistance of the circuitry to change. The change in resistance causes a resistive defect in the circuitry to transition between a failure and recovery state. A gated latch 328 is coupled to the IC tester 312 and adapted to capture the operating state of an output from the IC that changes with the failure/recovery state transition. The output of the latch is fed to an image processor 334 and is used to amplify the image contrast of the processor 334.

An image of the IC 300 is provided to the image processor 334 using a position signal 338 from the light scanner 324 and from an output signal 340 from a photodetector 342. The position signal 338 indicates the location of the laser beam on the IC 300 at any instant in time to generate a map of the change in the incidence of functional failures in the IC 300 upon localized heating by the laser beam. The photodetector 342 detects a return portion of the laser beam 320 that is reflected or scattered from the IC 300, and used in combination with the position signal 338 to form an image. The resulting image is displayed at CRT display 336, and the resistive portion of the image is identified using the contrast amplification provided by the latch 328. In various implementations, the portions of the system included within dotted lines 346 are part of a scanning optical microscope (SOM), and the portions of the system included within dotted lines 332 are part of a laboratory display.

Figure 4:
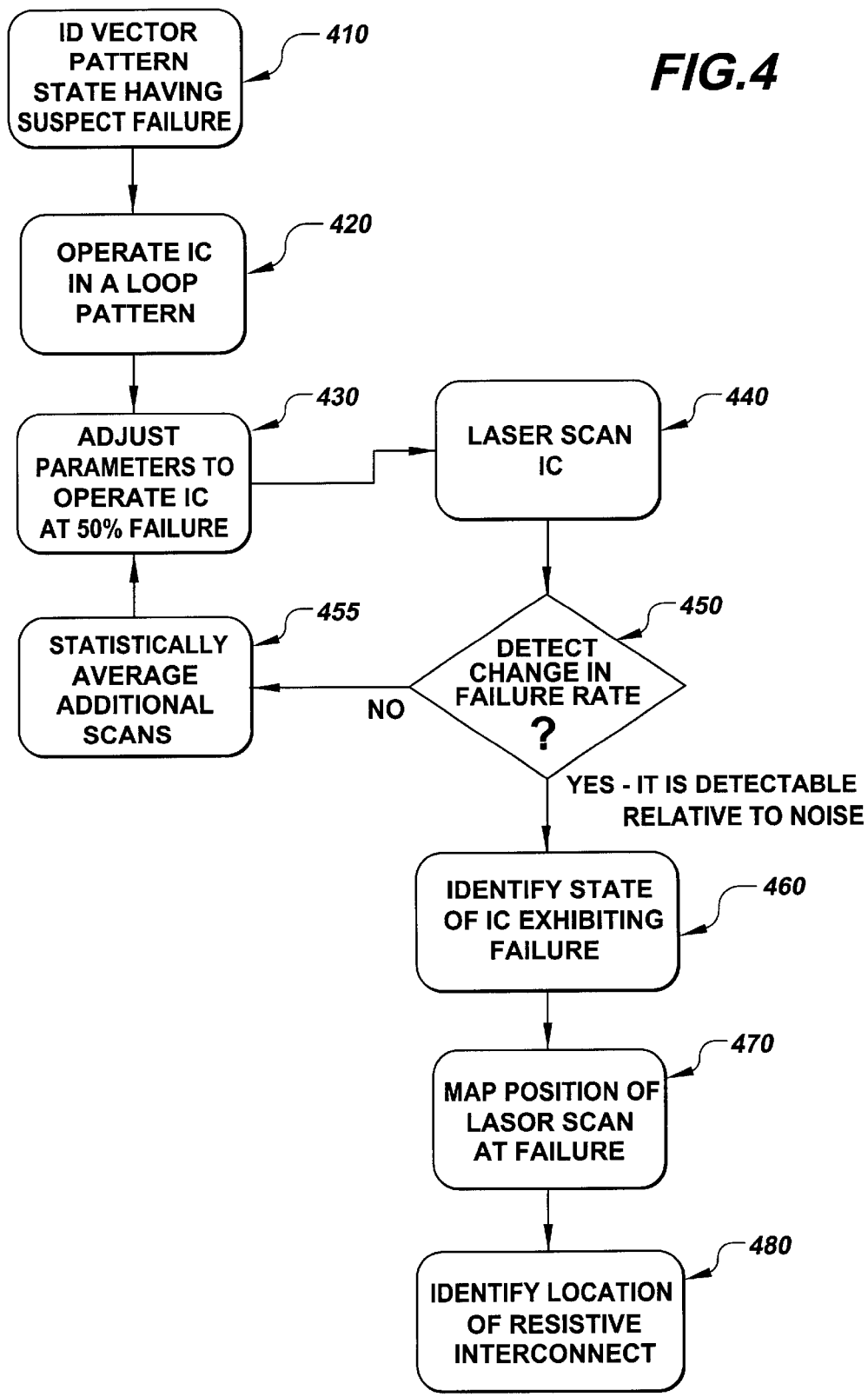
FIG. 4 is a flow diagram for analyzing a semiconductor device, according to another example embodiment of the present invention.

FIG. 4 illustrates another example process that can be used for resistive interconnection localization, according to the present invention. At block 410, a vector pattern state having a suspect failure is identified. The IC is operated in a loop pattern at block 420, and the operational parameters are adjusted so that the IC fails at a 50% failure rate at block 430. A laser is scanned onto the IC at block 440, and a detector is used to detect any changes in the failure rate of the IC at block 450. If the failure rate does not change, the process resumes at block 455, wherein additional scans are statistically averaged until sufficient statistics are accumulated to detect a change in the operating state, as may be viewed on the monitor (e.g. until a "dark" spot is clearly discernable). If a change in failure rate is detected, the operating state (e.g. the logic state) of the IC during the change in failure rate is identified at block 460. The location of the defect may be accomplished by overlying the dark or otherwise discernable spot representing the defect location onto an image of the die.

Causing and identifying a change in failure rate can be accomplished using various methods and arrangements including those described herein. For instance, in alternative implementations, the IC is operated in a loop pattern and with operational parameters adjusted so that the IC fails at a rate other than 50%, such as 40% or 60%. Operating at such alternative rates, or adjusting the failure rate may be preferred for capturing the logic state associated with the failure transition, helpful for the target circuitry, and/or with the monitoring equipment used to identify and determine the cause of the circuit defect/failure. These alternative rates may be helpful, for example, as the rate of passing to failing is changed to identify the point/location of failure.

Figure 5:
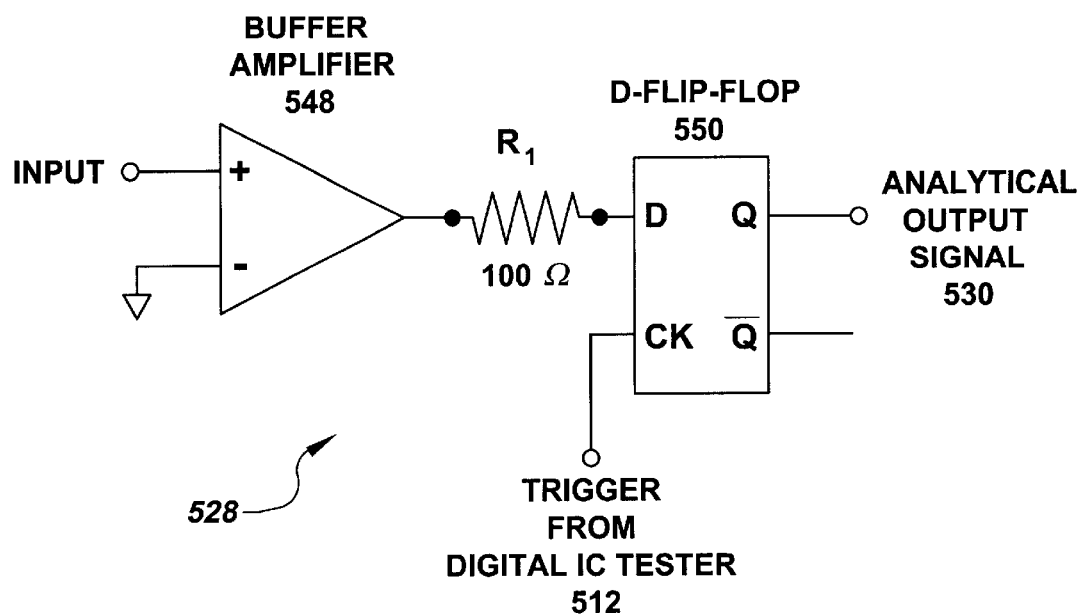
FIG. 5 is an example latching circuit that may be used in connection with the example system embodiment of FIG. 3.

Also, a hardware latch, such as the latch shown in FIG. 5, or a software latch can be used to capture the logic state associated with the failure transition. One advantage of using a software latch is that the IC being tested is not placed under a load at the pin from which a signal is obtained. This is useful because loading the I/O pin can cause changes in the timing that can require a re-characterization of the IC being tested. For information regarding manners in which to test IC timing characteristics, reference may be made to U.S. patent application Ser. No. 09/586,572, entitled "Data Processing Device Test Apparatus and Method Therefor", now U.S. Pat. No. 6,546,513.

Once the failure state is identified, the position of the laser scan that causes the change in failure rate is mapped at block 470 in FIG. 4. Using the mapped position of the laser scan, the location of a portion of circuitry within the die that is associated with a resistive defect is identified at block 480.

In one implementation, light reflected from the laser scan is used to create an image of the IC at block 440. The output of a latch that is used to capture the logic state associated with the failure is coupled to an amplifier that controls the contrast of the image of the IC that is obtained at block 440. As the failure rate changes, the output of the latch, and thus the output of the amplifier, changes. This causes a change in the contrast of the portion of the IC being imaged at the time of the change in failure rate.

In other words, when the laser beam hits a resistive interconnect, it causes the metal in the resistive interconnect to expand, which causes the failure rate of the IC to change. The change in failure rate affects the output of the IC, which in turn is captured by a latch arrangement, such as by triggering the latch arrangement with a tester coupled to the IC. The output of the latch is fed to an amplifier used to control an image contrast in an image processor. The laser light reflecting off of the area having the resistive interconnect is detected (such as by using a photodetector) and sent to the image processor. The processor displays the image using a contrast that is controlled by the amplifier. As the output from the latch varies, the contrast amplification also varies. Therefore, when the laser scan hits a resistive interconnect, the contrast amplification varies, and the image obtained using the reflected laser light is displayed having a contrast that is different had the failure rate not changed. The portion of the image of the IC having a variance in contrast is then used to identify the portion of the IC having the resistive defect. If desired, the laser scan can be repeated and averaged to improve the signal-to-noise ratio and the ability to detect a change in the failure rate.

FIG. 5 is an example latch 528 that may be used in connection with the example systems and methods described herein using a buffer amplifier 548 and a D-flip-flop 550. The buffer amplifier 548 receives as its input the output state to be detected (or an output voltage from the IC 300 of FIG. 3 which is representative of the output state to be detected) and amplifies the input (e.g. by a factor of two) to provide an amplified output voltage. The amplified output voltage is then fed into a D input (i.e. a data input) of the D-flip-flop 550, with the D-flip-flop 550 being triggered at a CK input (i.e. a clock input) by a digital IC test trigger 512. The signal level of the D input is then transferred to a Q output of the D-flip-flop 550 during a positive-going transition of a triggering clock pulse (the $\overline{Q}$ output is not used). The Q output value will remain constant until another positive-going clock pulse is received by the D-flip-flop and the state of the output state from the IC has changed. Thus, the analytical output signal 530 is in a first state when the output state of an IC has an incorrect value and switches to a second state when the output signal 530 depends directly on the incidence of functional failures in the IC being tested so that any changes in the incidence of the functional failures can be measured. The analytical output signal 530 can be amplified, if necessary, to provide a predetermined level of contrast (i.e. a grayscale level) for the display 532 to better identify the resistive defect.

Figure 6:
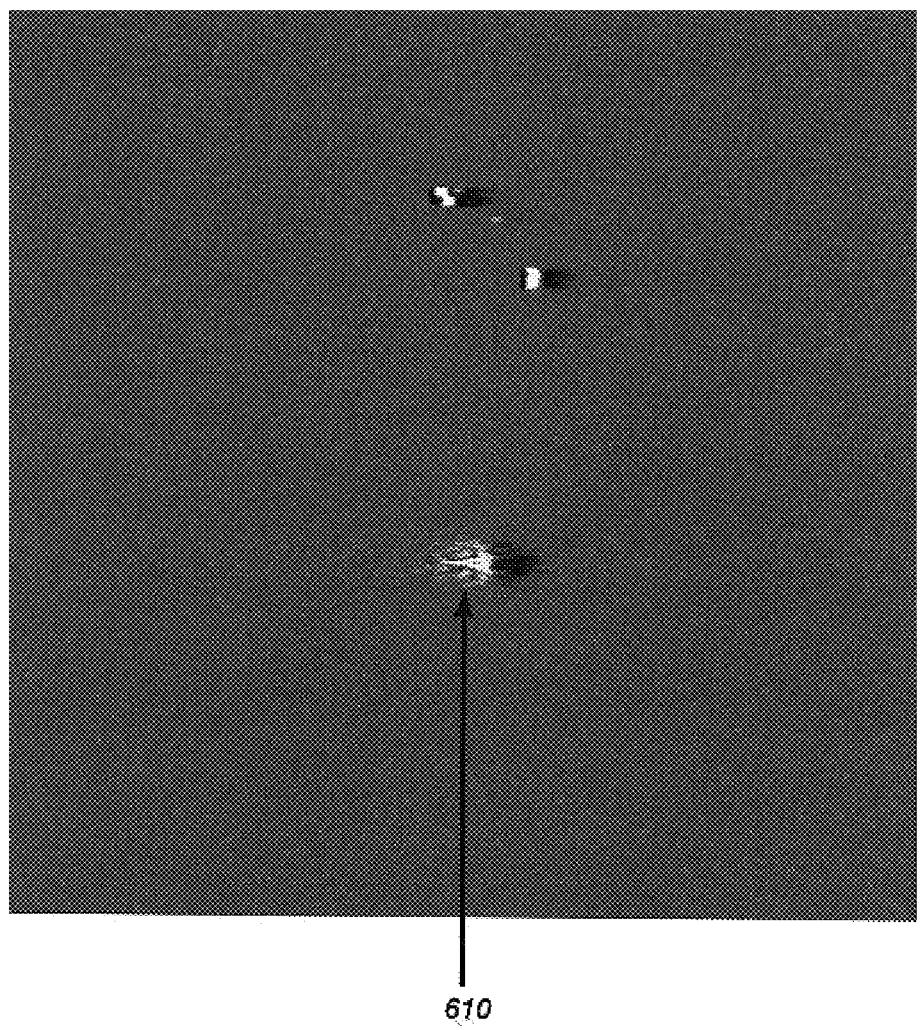
FIGS. 6 and 7 are, respectively, backside resistivity-interconnect-localization ("RIL") and reflected-light images of a suspected resistive interconnection in an integrated circuit, as identified according to a specific example implementation of the present invention.
Figure 7:
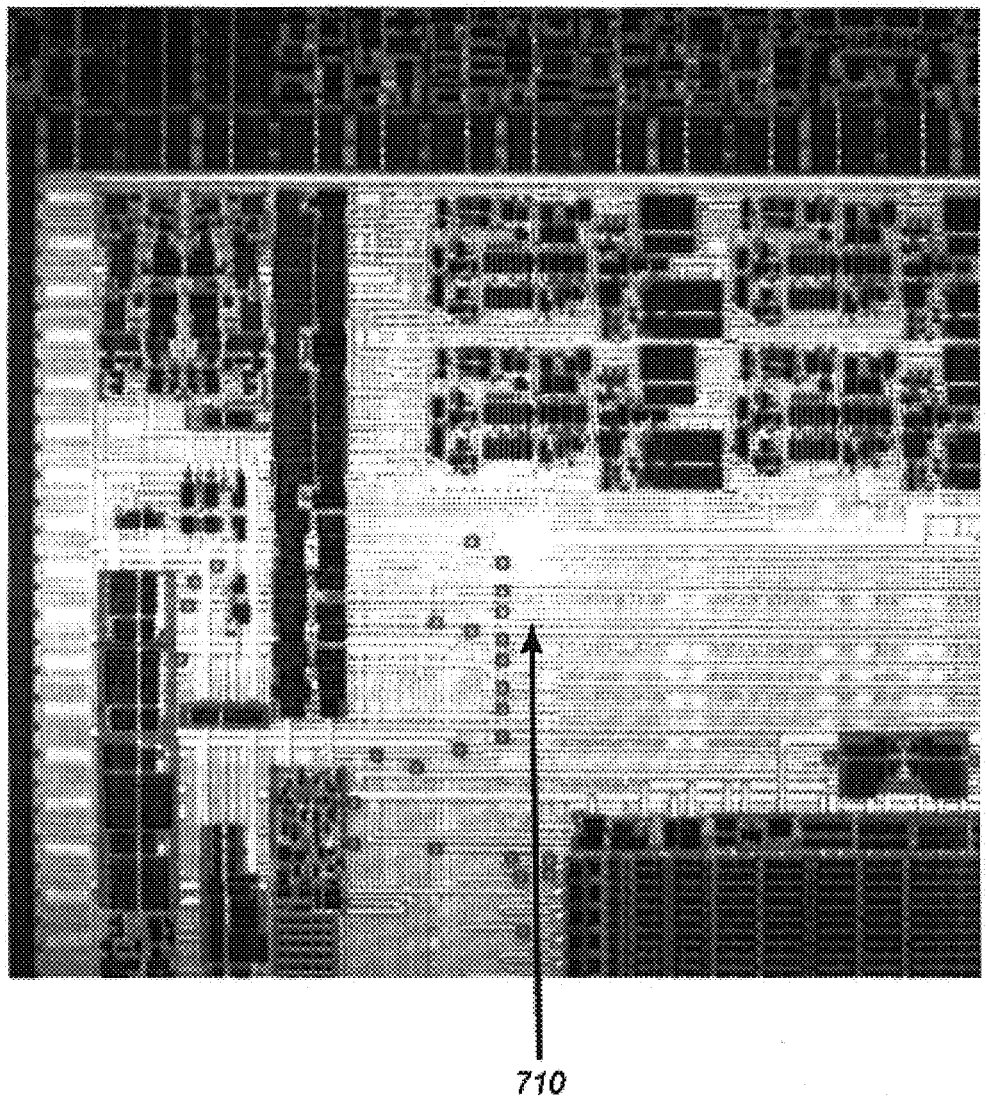

Various images can be obtained for resistive defects using the methods and arrangements described herein. For example, FIGS. 6 and 7 are, respectively, backside resistivity-interconnect-localization ("RIL") and reflected-light images of a suspected resistive interconnection in an integrated circuit, as identified according to a specific example implementation of the present invention. The portion 610 of FIG. 6 and 710 of FIG. 7 exhibiting a contrast variation is indicative of a region in the die being imaged having a resistive defect.

Figure 8:
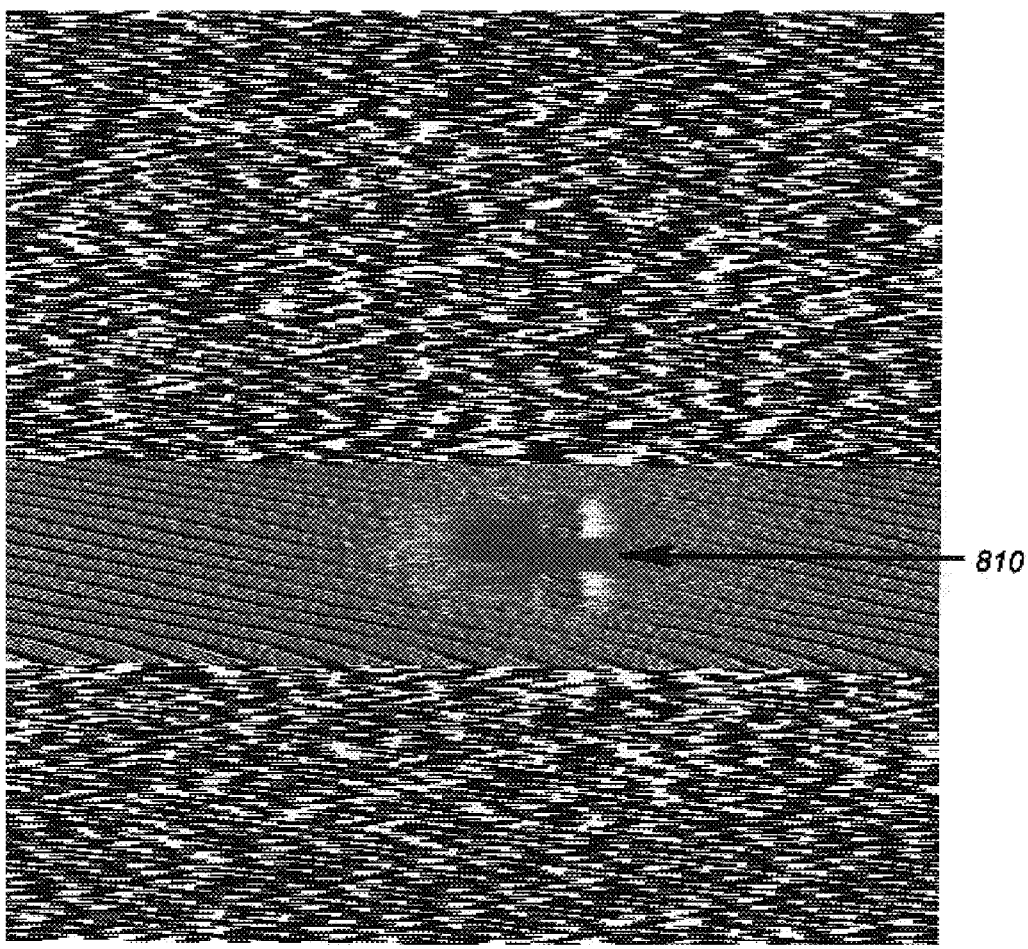
FIGS. 8 and 9 are, respectively, backside RIL and reflected light images of a suspect conductive via interconnecting two adjacent metal layers, as identified according to another specific example implementation of the present invention.
Figure 9:
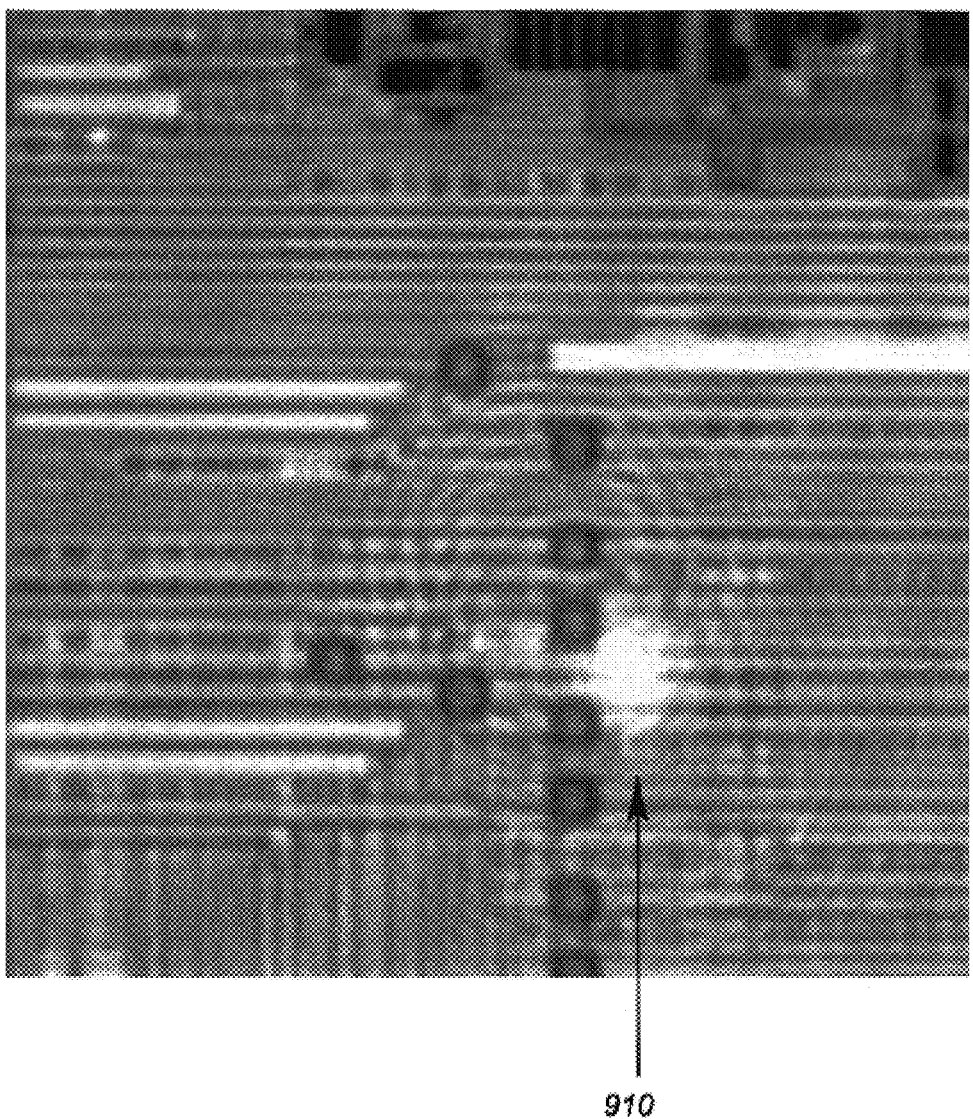

FIGS. 8 and 9 are, respectively, a magnified view of the backside RIL and reflected light images of the suspect resistive interconnection of FIGS. 6 and 7. Contrast variations 810 in FIG. 8 and 910 in FIG. 9 show the portion of the interconnect having a resistive defect. Such a magnified view is useful for more specifically identifying the resistive defect.

Figure 10:
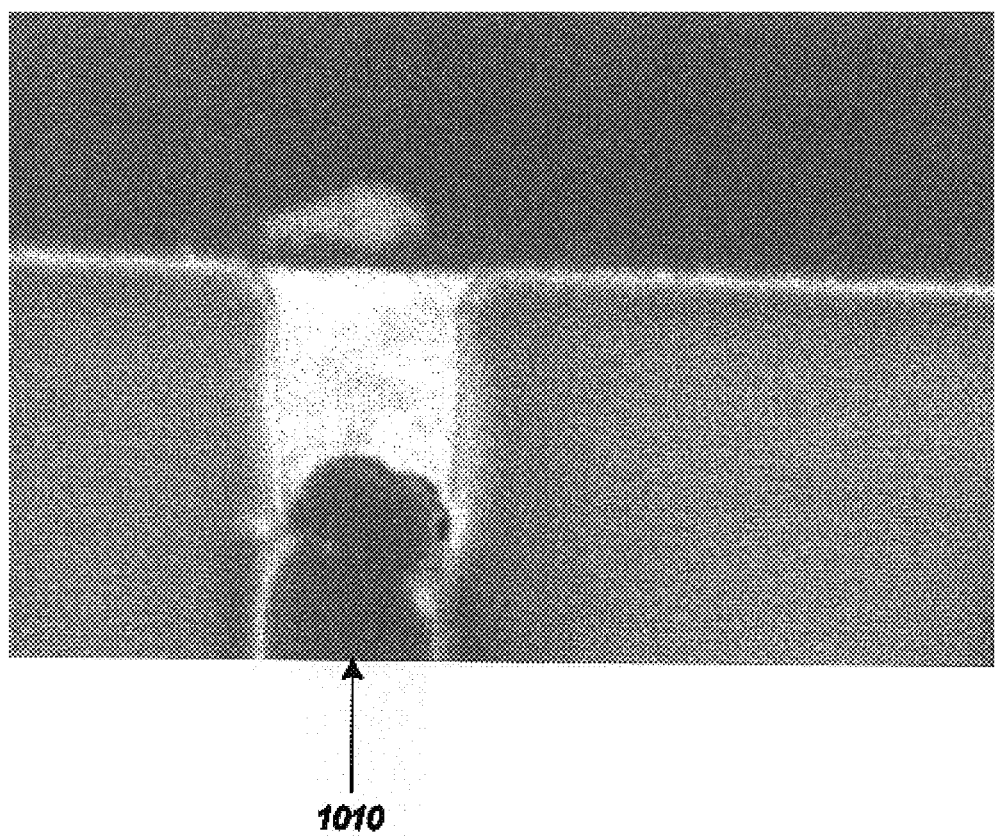
FIG. 10 is a FIB (focused ion beam) cross section of the suspect via shown in FIGS. 6–9, as identified according to the present invention.

FIG. 10 is a FIB (focused ion beam) cross section of the suspect via shown in FIGS. 6–9, as identified according to an example implementation of the present invention. Once the resistive defect is located using images as shown in FIGS. 6–9, the actual defective metal connection can be isolated and verified using such a FIB cross-section.

The following describes one particular example instance wherein the present invention is advantageously used. A die having failed functional, speed, built-in-self-test (BIST), RESET, and automatic test program generation (ATPG) scan tests across production temperatures of 0, 25 and 90 degrees Celsius, and yet having good continuity and passing all pin leakage, dynamic, and static IDD tests is analyzed. The ATPG test identifies failing flip-flops within the microcode ROM macro (MEROM), wherein each of the flops are located close to one another. The BIST failure also includes failure of a test for MEROM. The die is tested at various supply voltages, and a voltage-dependent failure of the unit indicates that either there is an error in the combinational logic between scan flops or that the flop in question doesn't capture the correct state prior to shifting the scan sequence out. Low voltage supplied with a varied voltage supply is used to nullify the cause of the failure and to effectively identify that the data latching ability of the flop is intact and that the defect is not due to a defective pad.

Next, temperature dependency is used to show that higher temperatures result in fewer failures. In connection with the present invention, it has been discovered that, by using a source that primarily generates heat, such as a laser having a wavelength of about 1320 nanometers, metal in the area to which the laser is directed is caused to expand, and the expansion can be used to cause the die to electrically transition between failure and recovered states. This electrical transition is attributed to defective circuitry that, during expansion, generates an electrical change. In one particular example application, the portion of the metal is located in a region of the die in which no suspect active structures are located. Therefore, the electrical change is attributed to expanding metal making better contact to the underlying metal (e.g., Al), and the site to which the laser is directed can be located on a mapping layout to identify a defective contact interconnect or via. In addition, the interconnect may be in poor contact at the interface, and the heat may improve the contact, thereby reducing resistivity and increasing signal speed.

The above example lists particular types of tests and analyses that can be performed for identifying a defective circuit path in a semiconductor die. However, there are various manners in which to do so. The present invention is applicable for use with various commonly-used failure analysis methods, and is particularly useful when those methods do not enable the detection of a particular defective portion of the die due to a resistive circuit path in the die.

In another example embodiment of the present invention, the IC die is operated in a ramping mode that enables the capture of signals from the die without overheating the die. The die is operated under conditions that cause heat generation in the die at a controlled rate. The controlled rate is selected so that the die heats sufficiently slowly to make possible the observation of a failure/recovery transition of the die due to resistivity. As the die reaches a transition temperature, a laser scanned across the die causes a region exhibiting resistivity to transition between a failed state and a recovered state. The transition is detected and used to identify the location of a resistive defect, such as described hereinabove. The detection can be accomplished without necessarily averaging various laser scans (as discussed in connection with FIG. 4.). This is particularly useful in instances wherein the die is difficult to keep under thermal control. More specifically, a die may exhibit thermal runaway when being cycled through operational loops, making it difficult to achieve selected failure rates without slowing the operation of the die down. With a slower loop time, signals can be more difficult to obtain from the die. This particular example embodiment makes possible obtaining a signal from a die operating at a sufficiently fast loop speed without allowing the die to go into thermal runaway.

For more information including that regarding the various example embodiments described herein, reference may be made to the appendix attached hereto, which is fully incorporated herein by reference.

While the present invention has been described with reference to several particular example embodiments, those skilled in the art will recognize that many changes may be made thereto without departing from the spirit and scope of the present invention, which is set forth in the following claims.

What is claimed is:

1. A method for analyzing a semiconductor die, the method comprising:
   heating at least a selected portion of state-changing circuitry in the semiconductor die to cause a failure due to suspect circuitry, the state-changing circuitry including a suspect signal path site;
   detecting, in response to the selected portion being heated, a state-changing transition between a failed mode and a recovered mode in the suspect signal path site; and
   using the detected state-changing transition, determining that the signal path site has a resistivity that changes between the failed mode and the recovered mode.

2. The method of claim 1, wherein heating at least a selected portion of state-changing circuitry in the semiconductor die includes scanning the die with a laser.

3. The method of claim 2, further comprising:
   identifying the portion of the die at which the laser is directed while detecting the state-changing transition, wherein determining that the signal path site has a resistivity that changes includes determining that the signal path site changes when scanned with the laser; and
   using the identified portion to determine the location of the resistive signal path site.

4. The method of claim 1, further comprising electrically operating the die to cause the circuitry to change state in response to at least one of: an input frequency, a controlled voltage supplied to the die and a controlled die temperature.

5. The method of claim 1, wherein using the detected state-changing transition includes using an image of the operating circuitry and a map of signal paths, further comprising using the image and map to identify the location of the resistive signal path site.

6. The method of claim 1, wherein identifying one of the circuit paths that electrically changes in response to heat includes detecting a change in a failure rate of the circuit path during a state-changing operation.

7. The method of claim 1, further comprising thinning the die prior to the heating.

8. The method of claim 1, wherein heating at least a selected portion of state-changing circuitry includes causing the suspect signal path site to expand.

9. The method of claim 1, further comprising obtaining a cross-sectional image of the suspect signal path site and determining therefrom the portion of the signal path site having a resistivity that changes.

10. The method of claim 1, wherein detecting a state-changing transition between a failed mode and a recovered mode includes detecting that the die is operating improperly.

11. The method of claim 1, further comprising observing a delayed response from the die and determining therefrom that the die includes a resistive defect, prior to the heating.

12. The method of claim 1, further comprising using a scanning optical microscope (SOM).

13. The method of claim 1, further comprising placing the die in a test arrangement adapted to electrically operate the die under selected operating conditions and to obtain a response from the die including the state-changing transition.

14. A system for analyzing a semiconductor die, the system comprising:
- a scanning optical microscope (SOM) adapted to direct a laser and heat at least a selected portion of state-changing circuitry in the semiconductor die to cause a failure due to suspect circuitry, the state-changing circuitry including a suspect signal path site;
- a detector adapted to detect, in response to the selected portion being heated, a state-changing transition between a failed mode and a recovered mode in the suspect signal path site; and
- a display adapted to use the detected state-changing transition and to display an image of the die to be used for determining that the signal path site has a resistivity that changes between the failed mode and the recovered mode.

15. The system of claim 14, wherein the SOM, the detector, and the display are communicatively coupled to each other.

16. The system of claim 15, wherein the display includes an image contrast amplifier, and wherein the detector includes an output adapted to supply a control signal to the image contrast amplifier in response to the transition between the failed mode and the recovered mode.

17. The system of claim 16, wherein the SOM further comprises:
- a photodetector adapted to detect reflected light from the die as it is scanned with the laser and to provide a signal representing the detected light to the display; and
- a position sensor adapted to provide the position of the laser upon the die.

18. The system of claim 17, wherein the display is adapted to use the signal representing the detected light and the position sensor to display an image of the die, and wherein the contrast of the image of the resistive signal path is altered from that of a non-defective die.

19. A method for analyzing a semiconductor die, the method comprising:
- heating at least a selected portion of state-changing circuitry in the semiconductor die to cause a failure due to suspect circuitry, the state-changing circuitry including a suspect signal path site;
- detecting, in response to the selected portion being heated, a state-changing transition between a failed mode and a recovered mode in the suspect signal path site;
- using the detected state-changing transition, determining that the signal path site has a resistivity that changes between the failed mode and the recovered mode;
- electrically operating the die to cause the circuitry to change state in response to at least one of: an input frequency, a controlled voltage supplied to the die and a controlled die temperature; and
- electrically operating the die in a loop that causes the die to fail at a selected failure rate.

20. The method of claim 19, wherein detecting a state-changing transition includes detecting that the failure rate has changed.

21. A method for analyzing a semiconductor die having suspect circuitry that includes a multitude of circuit paths, the method comprising:
- while using a state-changing operation of the suspect circuitry to cause a failure due to the suspect circuitry, identifying one of the circuit paths that electrically changes in response to heat and detecting that a particular circuit portion therein is resistive.

22. A method for testing an integrated circuit (IC), the method comprising:
- operating the IC in a loop that causes the IC to fail at a selected failure rate;
- laser-scanning the IC and detecting a response from the IC, the response including a change in the failure rate of the IC responsive to laser scanning a portion of the IC;
- using the detected response as an input control to a contrast amplifier of a display adapted to receive image data including reflected light data from the laser scanning of the IC;
- displaying the image data using the contrast amplifier to control the contrast of the image; and
- identifying the portion of the IC being scanned that corresponds to the change in failure rate as a portion of the image having a variation in contrast and detecting therefrom that the portion includes a resistive interconnect.

23. A system for analyzing a semiconductor die, the system comprising:
- means for heating at least a selected portion of state-changing circuitry in the semiconductor die to cause a failure due to suspect circuitry, the state-changing circuitry including a suspect signal path site;
- means for detecting, in response to the selected portion being heated, a state-changing transition between a failed mode and a recovered mode in the suspect signal path site; and
- means for using the detected state-changing transition, determining that the signal path site has a resistivity that changes between the failed mode and the recovered mode.

* * * * *

UNITED STATES PATENT AND TRADEMARK OFFICE
CERTIFICATE OF CORRECTION

PATENT NO. : 7,062,399 B1
APPLICATION NO. : 09/586518
DATED : June 13, 2006
INVENTOR(S) : Bruce et al.

Page 1 of 1

It is certified that error appears in the above-identified patent and that said Letters Patent is hereby corrected as shown below:

on title Page item (75) Inventors: "Edward Jr. I. Cole, Albuquerque, NM," should read --Edward I. Cole, Jr., Albuquerque, NM,- item (73) Assignee: "Advance Micro Devices, Inc.," should read --Advanced Micro Devices, Inc.,--.

Signed and Sealed this

Fifteenth Day of August, 2006

JON W. DUDAS
*Director of the United States Patent and Trademark Office*